United States Patent [19]

Madsen et al.

[11] 4,135,293

[45] Jan. 23, 1979

[54] SUPERCONDUCTING MEMBERS AND METHODS OF MANUFACTURING THEREOF

[75] Inventors: Peter E. Madsen; James A. Lee, both of Harwell; Derek Armstrong, Wallingford, all of England

[73] Assignee: United Kingdom Atomic Energy Authority, London, United Kingdom

[21] Appl. No.: 617,640

[22] Filed: Sep. 29, 1975

[30] Foreign Application Priority Data

Oct. 1, 1974 [GB] United Kingdom ............... 42651/74

[51] Int. Cl.² .......................................... H01V 11/00
[52] U.S. Cl. ..................................... 29/599; 148/133; 174/126 S
[58] Field of Search .......................... 29/599; 148/133; 174/DIG. 6

[56] References Cited

U.S. PATENT DOCUMENTS

| 3,652,967 | 3/1972 | Tanaka et al. | 29/599 |
| 3,665,595 | 5/1972 | Tanaka et al. | 29/599 |
| 3,728,165 | 4/1973 | Howlett | 29/599 |
| 3,813,764 | 6/1974 | Tanaka et al. | 29/599 |
| 3,868,768 | 3/1975 | Meyer | 29/599 |
| 3,874,074 | 4/1975 | Meyer | 29/599 |
| 3,876,473 | 1/1974 | McDougall | 29/599 |
| 3,958,327 | 5/1976 | Marancik et al. | 29/599 |
| 3,996,661 | 12/1976 | Ziegler et al. | 29/599 |

FOREIGN PATENT DOCUMENTS

| 2195090 | 1/1974 | France | 29/599 |
| 1333554 | 10/1973 | United Kingdom | 29/599 |
| 1394724 | 5/1975 | United Kingdom | 29/599 |

*Primary Examiner*—C. W. Lanham
*Assistant Examiner*—V. K. Rising
*Attorney, Agent, or Firm*—Larson, Taylor and Hinds; Larson, Taylor, et al

[57] ABSTRACT

A superconductor of the general formula $A_3B$, e.g. $Nb_3Sn$, is manufactured by mechanical fabrication of A filaments in a bronze containing B followed by heat treatment to form $A_3B$ by solid state reaction from B diffusing through the bronze without melting of the bronze. A pure metal for stabilization is mechanically fabricated together with the other components and protected from diffusion thereinto of any of the other components by a barrier layer of A metal. Superconductor formation on the barrier layer of A metal during the heat treatment is avoided or reduced by surface treatment or surface coating which inhibits $A_3$ reaction between A and B at the barrier.

9 Claims, 5 Drawing Figures

SUPERCONDUCTING MEMBERS AND METHODS OF MANUFACTURING THEREOF

BACKGROUND OF THE INVENTION

The invention relates to superconductors and methods of manufacture thereof.

By superconducting member is meant a member which will exhibit superconductivity when its temperature is lowered below its critical temperature. Materials of particular interest in this field are those which have comparatively high critical temperatures and comparatively high critical magnetic fields. Such materials are compounds of the A15 crystal structure having the general formula $A_3B$ where A comprises niobium or vanadium and B typically comprises one or more of the elements aluminium, gallium, indium, silicon, germanium, and tin.

The invention is more particularly concerned with the manufacture of a superconducting member comprising a large number of fine superconductive filaments supported in an electrically conductive, non-superconductive matrix, and is an improvement in or development of the inventions described in British Pat. Nos. 1,333,554 and 1,394,724.

It is desirable to have regions of pure metal with high electrical and thermal conductivity, for example pure copper or aluminium, incorporated in multifilamentary superconducting composites to provide additional stabilization. The pure metal provides dynamic stabilization by damping flux movements and by acting as a sink for any heat produced. To be effective the pure metal should be situated as close to the superconducting filaments as possible.

Provision of a pure metal such as copper adjacent to the filaments presents little difficulty with a ductile superconductor like the niobium-titanium alloys because there is little pick up of niobium or titanium by copper under the annealing conditions carried out for fabrication or heat treatment to obtain optimum critical currents in the niobium-titanium superconductor.

$A_3B$ compounds with the A15 crystal structure are sometimes superconducting with high temperatures of transition from the superconducting to the normal state. These compounds cannot be produced as multifilamentary superconductors by techniques suitable for ductile superconductors because they are very hard and brittle materials. One method suitable for producing $A_3B$ compounds as multifilamentary superconductors is described in British Patent No. 1,333,554. For example, rods or wires of the element A are embedded in a matrix of a carrier metal containing the element B. Copper is a suitable carrier metal for the production of $Nb_3Sn$ or $V_3Ga$ by this method and the alloy of the carrier metal with the element B is conveniently referred to as "the bronze" or "the Cu-B alloy". The B element is generally in solid solution in the carrier metal since this provides a ductile alloy, but the method can also work when the B element is also present in other phases in the bronze. The element A and the Cu-B alloy may both contain additions of other elements. The composite of rods of element A in a matrix of bronze is fabricated by a simple mechanical deformation process to produce fine filaments of element A in the required configuration in the bronze matrix. The filaments of element A are then converted to compound $A_3B$ by reaction with the B element from the bronze by heating in a temperature range in which the bronze in contact with element A remains in the solid state.

The compound $A_3B$ produced by this technique will be left in a copper alloy still containing some element B in solid solution. The element B increases the resistivity of the copper considerably so that the residual bronze matrix containing the $A_3B$ filaments is not the best material to provide dynamic stabilization. If the extra stabilization provided by pure metals such as copper or aluminium is required these materials must be incorporated into the composite superconductor in some way. In some circumstances where the superconductor can be handled in the reacted condition (i.e. with the $A_3B$ filaments present) it may be possible to put the pure metal with suitably low resistivity on the outside of the superconductor by some room temperature operation, e.g. by electrodeposition. However, in many circumstances one cannot avoid heating the pure metal with the composite superconductor. For example, this would occur (a) if the pure metal is put on to the composite by some hot working process, or (b) if the pure metal is incorporated inside the composite when it must of necessity be present during some of the fabrication processes, or (c) if the superconductor is wound in unreacted form to the required final shape (e.g. solenoid winding) and then reacted. In all these examples the pure metal will be in contact with the bronze and on heat treatment the element B will diffuse from the bronze into the pure metal. This will increase the resistivity of the pure metal and make it less effective for stabilization.

A solution to this problem, allowing pure metal to be incorporated in the superconducting composite, is to isolate the pure metal by a barrier of metal which prevents diffusion of the B element from the bronze into the pure metal. Besides being impermeable to the B element at the reaction temperature, the barrier material must be insoluble in the pure metal and must be ductile enough to be fabricated with the superconductor and provide a continuous barrier separating the pure metal from the bronze after these treatments. Use of such barrier materials is described in Patent No. 1,394,724. In the example in which $Nb_3Sn$ was produced by reaction of niobium with a copper tin bronze and where copper was used for stabilization the preferred barrier material was tantalum. In producing superconducting composites it has been found that although tantalum is a satisfactory barrier material when the deformation is not too great, failures of the tantalum barriers have occurred after extensive deformation for producing multifilamentary wire with the particularly fine filaments desirable for optimum superconducting properties. In experiments under these conditions, we have observed the niobium filaments have remained continuous and deformed in a fairly uniform manner. We concluded the mechanical fabrication of the superconducting composites would be easier if the filaments and barriers had the same mechanical properties, specifically if the same material were used for both.

The use of barriers of the A metal is described in British Pat. No. 1,394,724. It is pointed out that the A metal is often impermeable to the B element at the temperature at which the $A_3B$ compound is formed by solid state reaction. In particular niobium dissolves very little tin in solid solution below about 900° C. The use of thin tubes of metal A (e.g. niobium) filled with bronze and embedded in a matrix of pure metal is described for the special case where the diameter of the tubes is in the range necessary for filamentary stabilization. However in more general applications, the formation of a layer of $A_3B$ at the interface between the barrier of the element A and the bronze may take these barriers less suitable than barriers of other materials which do not react with the bronze to form high field superconducting compounds. Thus the layer of $A_3B$ compound at the barrier may shield the pure metal from flux jumps outside the barrier so that the pure metal is prevented from providing effective stabilization. Also the layer of $A_3B$ compound at the barrier may itself cause instabilities since it would generally present a larger dimension transverse to the magnetic field than the $A_3B$ compound filaments would. On the other hand the close proximity of the pure metal to these $A_3B$ compound layers would tend to stabilise them against flux jumping. Apart from these objections to the $A_3B$ formation on stability grounds its formation can lead to the failure of the barrier during heat treatment. The barriers do not thin down completely uniformly on deformation. At the thinner parts $A_3B$ compound formation can penetrate through the barrier even although the majority of the barrier remains effective. Once $A_3B$ compound is in contact with the pure metal the latter can start picking up B atoms and its electrical resistivity will start to rise.

SUMMARY OF THE INVENTION

The present invention provides a method by which the formation of a layer of a superconducting compound $A_3B$ at the barrier of a metal A (protecting a pure metal such as copper from contamination by B) in contact with a bronze containing B can be prevented or reduced so that the pure metal can provide effective stabilization.

The invention provides a method of manufacturing a superconducting member embodying a superconductor of A15 crystal structure having the general formula $A_3B$, where A comprises niobium or vanadium metal and B is one or more elements which when reacted with the metal A will form the said superconductor, which method comprises forming a composite material essentially consisting of a carrier material (as herein defined) and one or more of the elements B, providing a plurality of discrete rods of a base material essentially consisting of the metal A within and in contact with the composite material, forming the composite material with the rods of base material therein and a metal, which is eventually to provide stabilization, into a unitary structure in which a barrier layer of a metal A impermeable to the B element or elements is located as a diffusion barrier separating the stabilizing metal from the composite material along the whole length of the unitary structure, there being provided at the interface between the composite material and the barrier layer an additive, which during subsequent heat treatment inhibits formation of superconducting $A_3B$ compound over the whole or a substantial part of the said interface, reducing the unitary structure to wire form by a mechanical reduction process whereby the rods of base material become filaments in a matrix of composite material and the stabilizing metal together with the barrier layer extend along the length of the wire, and heat treating the wire to cause reaction between the said filaments of base material and the B element or elements to form filaments of superconducting $A_3B$ compound, whilst said additive inhibits formation of superconducting $A_3B$ compound over the whole or a substantial part of the said interface.

In general, the B element(s) will be one or more of the elements of and the B element(s) will be one or more of the elements of the group consisting of aluminium, gallium, indium, silicon, germanium, gold, platinum, antimony, rhodium, palladium, osmium, ruthenium, cobalt, thallium, lead, arsenic, bismuth, iridium and tin.

Preferably the B element is one or more of the elements aluminium, gallium, indium, silicon, germanium and tin, and it is to be noted that certain of the possible B elements given in these groups will only form superconductive compounds with the A metal when they are in ternary combination with the A metal and another element of the group.

In the method of manufacture to which the present invention is primarily applicable to heat treatment is controlled for avoiding melting of the composite material in contact with the base material at any stage during the heat treatment.

The invention also provides a method of manufacturing a superconducting member embodying a superconductor of A15 crystal structure having the general formula $A_3B$, where A comprises niobium or vanadium metal and B is one or more elements which when reacted with the metal A will form the said superconductor, which method comprises forming a composite material essentially consisting of a carrier material (as herein defined) and one or more of the elements B, providing a plurality of discrete rods of a base material essentially consisting of the metal A within and in contact with the composite material, forming the composite material with the rods of base material therein and a metal, which is eventually to provide stabilization, into a unitary structure in which a barrier layer of a metal A impermeable to the B element or elements is located as a diffusion barrier separating the stabilizing metal from the composite material along the whole length of the unitary structure, and an additional barrier layer between the said barrier layer of metal A and the composite material, which additional barrier layer during subsequent heat treatment inhibits formation of superconducting $A_3B$ compound over the whole or a substantial part of the surface of the diffusion barrier layer of metal A which, but for the additional barrier layer would be in contact with the composite material, reducing the unitary structure to wire form by a mechanical reduction process whereby the rods of base material become filaments in a matrix of composite material and the stabilizing metal together with the barrier layer extend along the length of the wire, and heat treating the wire to cause reaction between the said filaments of base material and the B element or elements to form filaments of superconducting $A_3B$ compound, whilst said additional barrier layer inhibits formation of superconducting $A_3B$ compound over the whole or a substantial part of the said surface of the diffusion barrier layer.

The additional barrier layer is preferably impermeable to the B element or elements, but may, alternatively, be permeable to the B element or elements provided in inhibits reaction between permeating B atoms and the metal A. In this case, it is essential that the heat treatment is controlled for avoiding melting of composite material at any stage during the heat treatment both where the composite material is in contact with the filaments of base material and where it is in contact with the said additional layer or region.

The carrier material will in general essentially consist of an element from the group comprising copper, silver and gold, but requires selection to meet the following functional requirements, which define the carrier material:

(1) it should not react substantially with the base material under the heat treatment;

(2) considered together with the chosen B element or elements of the aforesaid group and the concentration of the B element or elements in the carrier material, there should be no unwanted compound which is formed under the range of temperature and element concentrations occuring during the reaction treatment.

By "unwanted compound" is meant any compound which interferes significantly with the formation of the superconducting material or with reaction between the base material and the B element or which interferes unacceptably with the superconducting properties of the product matrix.

It is to be understood that references to the composite material essentially consisting of a carrier material and at least one element from the said group are intended to include the use of carrier materials and/or the element or elements (which ultimately are reacted in the solid state with the base material to form a superconducting compound) with, or without, one or more other alloying elements in minor quantities, or acceptable impurities, or additives, or diluents being present therein. Such other alloying elements, impurities, additives or diluents essentially must not unacceptably affect the reaction between the base material and the said element which ultimately reacts with the base material to form the superconducting compound, and must not produce unacceptable deleterious effects on the superconducting properties of the superconducting compound formed.

Similarly, references to the base material include the use of such materials, with or without acceptable impurities or additives or diluents which do not unacceptably affect the reaction between the base material and the element which ultimately reacts with the base material to form the superconducting compound.

Preferably the composite material comprises a solid solution of the element or elements of the said group in the carrier material.

Two or more of the elements which are ultimately reacted with the base material to form a superconducting compound may exist together in solid solution in the carrier material. For example, Sn and Al may be present in the carrier material so that when reacted with niobium (base material) it forms a ternary superconductive compound which is basically $Nb_3Sn$ containing a small proportion of aluminium.

As mentioned in Patent Specification No. 1,333,554 it is envisaged that additives may be desirable in certain circumstances. For example, up to 25 percent by weight of tantalum may be included in niobium and improve significantly the mechanical properties of the niobium without seriously affecting the superconducting properties of the compound formed by the aforesaid method.

The invention includes a superconducting member made by any of the aforesaid methods.

Specific methods of manufacture and constructions of superconducting material embodying the invention will now be described by way of example and with reference to the drawings filed herewith, in which:

FIG. 1 is a diagrammatic enlarged cross-section of a matrix of composite material 12 in which is embedded filaments 11 of A metal and a cylinder 14 of stabilising metal surrounded by a barrier tube 13 of A metal. This is a configuration within the purview of the prior art but which would be rejected under prior art teaching as unsuitable.

Figure 1:
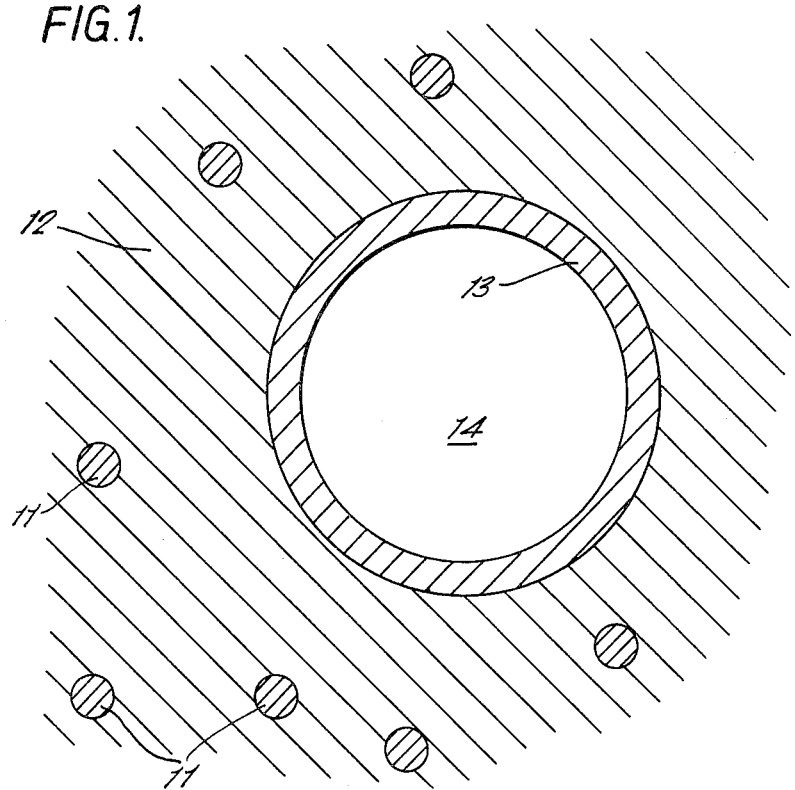

FIG. 1 illustrates the simple case of a cylinder of stabilising metal 14 (e.g. copper) surrounded by a barrier tube 13 of A metal embedded in composite material (bronze) 12 containing filaments of A metal 11. The A metal filaments 11, on heat treatment, react with B element or elements in the bronze 12 to form superconductive $A_3B$ compound filaments.

Figure 2:
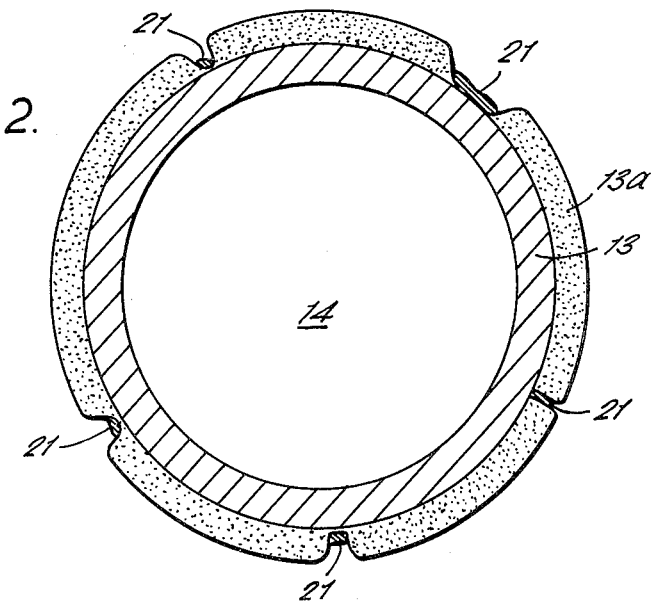
FIG. 2 is a diagrammatic enlarged cross-section of a part of FIG. 1, but modified in accordance with the present invention.
Figure 3:
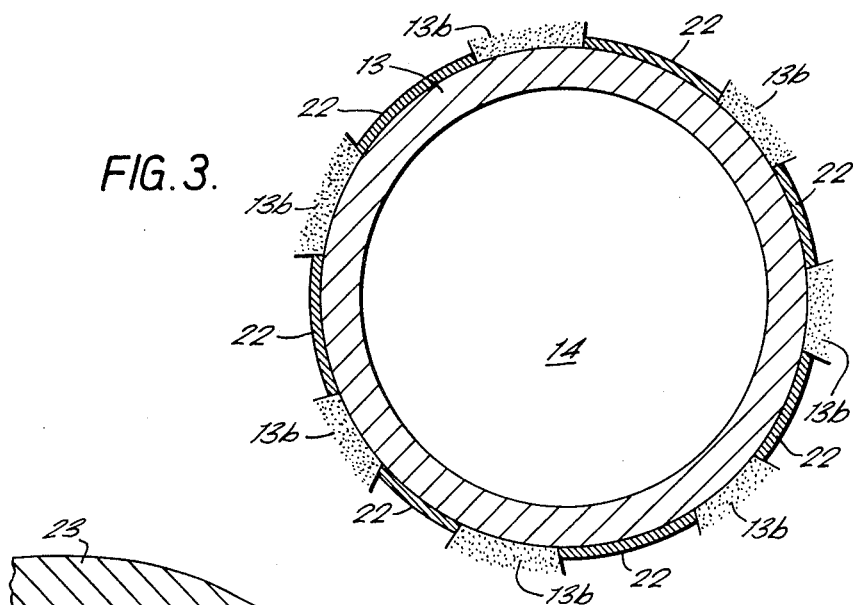
FIG. 3 is a diagrammatic enlarged cross-section of a part of FIG. 1, but showing an alternative modification in accordance with the present invention.
Figure 4:
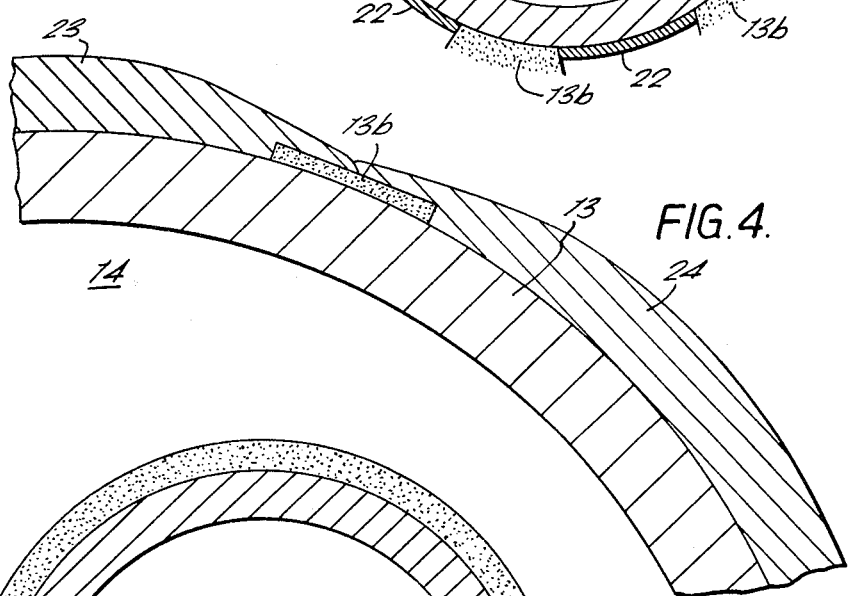
FIG. 4 is a diagrammatic enlarged cross-section of part of a variant of FIG. 3, illustrating an undesirable effect of making the regions 13b in FIG. 3 too small.
Figure 5:
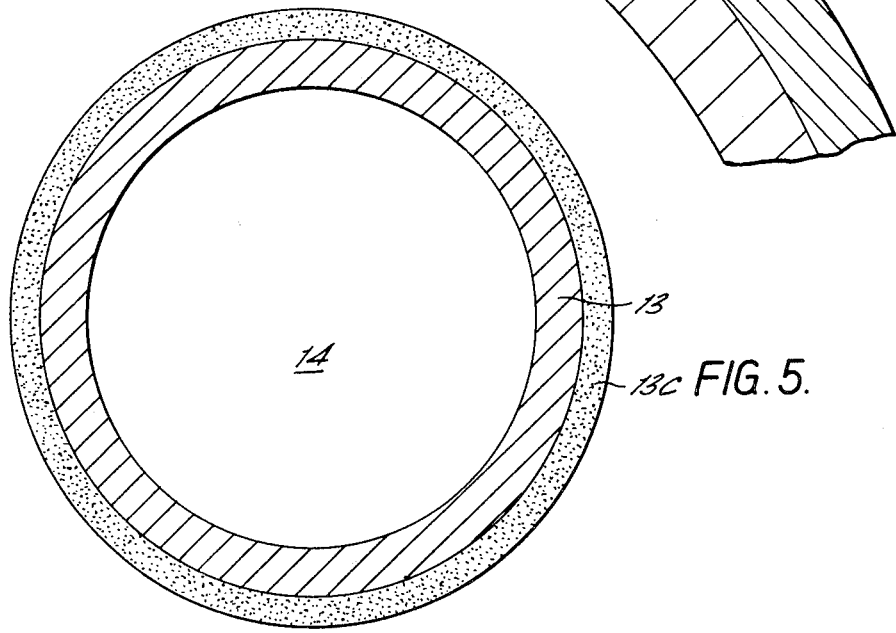
FIG. 5 is a diagrammatic enlarged cross-section of part of FIG. 1 showing a further alternative modification.

Embodiments of the present invention are illustrated in FIGS. 2, 3 and 5 and described for the simple basic configuration of FIG. 1. In FIGS. 2 to 5, however, the bronze 12 and filaments 11 are not shown. It is, however, to be appreciated that other matrix configurations may be employed. A variety of other possible configurations of barriers with respect to the bronze 12 and stabilising metal 14 are described in U.S. Pat. No. 1,394,724, to which reference should be made. The present invention is readily adapted to any of these other configurations.

In one example described in British Patent No. 1,333,554 a billet of copper-tin bronze is drilled with a plurality of holes into which are inserted rods of niobium. The billet is then drawn or extruded to form an extended wire comprising a copper-tin matrix carrying a plurality of niobium filaments. The wire is heat treated under controlled conditions, in particular, such that the bronze in contact with the niobium does not melt, but such that solid state reaction takes place between the tin and the niobium to form $Mb_3Sn$ filaments within the tin-depleted bronze matrix.

This general form of manufacturing procedure is followed in the examples of the present invention, except that pure metal for stabilisation is mechanically processed together with the composite material and the base material (niobium or vanadium), a barrier layer of an A metal is incorporated to protect the pure metal from diffusion thereinto of any of the other components, and there is provided means operative at the surface of the barrier layer in contact with bronze 12 for inhibiting formation of $A_3B$ compound in the barrier layer.

In FIG. 2, there is interposed between the barrier layer 13 and the bronze an additional barrier layer 13a of material impermeable to B atoms.

At first sight this arrangement seems to have no advantages over a single barrier of impermeable material as discussed in British Patent No. 1,394,724. This is true if a perfect barrier material for the superconductor composite system can be found. If, however, the barrier material is suitable in all respects (e.g. impermeable to B atoms and insoluble in the pure metal at the heat treatment temperatures, and forms no high field superconducting compounds with components of the bronze or with the pure metal) except that a few cracks develop in the barrier, such a barrier alone is unsatisfactory for preventing the bronze coming into contact with the pure metal where the cracks penetrate right through the barrier. However the barrier layer 13a in conjunction with the inner barrier layer 13 of the metal A is satisfactory, provided any cracking in the outer barrier layer 13a does not spread into and through the inner barrier layer 13. This is because $A_3B$ compound can only form where the bronze comes into contact with the A metal at cracks in the outer barrier, as illustrated at 21 in FIG. 2. These $A_3B$ compound regions should not interfere with the stabilizing effect of the copper since they are small in size and do not enclose the copper completely.

The outer barrier layer need not necessarily be continuous initially. For instance, strips 13b or segments of a tube may be placed around the periphery of the A metal tube 13 (FIG. 3). $A_3B$ compound will form at 22 between these strips or segments but magnetic flux can penetrate to the pure metal 14 in the regions between these regions of $A_3B$ compound. The size of the strips or segments of the outer tube will be governed by the size of the $A_3B$ compound regions which can be tolerated by stability considerations, and by the necessity to prevent adjacent $A_3B$ compound regions growing together as the $A_3B$ compound layers thicken on prolonged heat treatment. This latter situation, to be avoided, is illustrated in FIG. 4, wherein layers of $A_3B$ compound at 23 and 24 have grown together and enveloped the strip of outer barrier layer at 13b.

In the example of $Nb_3Sn$ grown by the solid state bronze technique an inner barrier 13 of niobium can be protected as described above with an outer barrier of tantalum.

In an alternative embodiment to that of FIG. 2, a thin layer impermeable to the B atoms is formed on the outside of the A metal barrier tubes by some surface treatment before the composite superconductor is assembled for fabrication. This layer will be in contact with the bronze after fabrication and will prevent $A_3B$ compound formation on the A metal barrier. This protection from $A_3B$ compound formation will remain satisfactory even if the layer breaks up on fabrication, provided that the fragments of the layer adhere to the barrier and prevent $A_3B$ formation over a large enough area to allow flux penetration to the pure metal within the barriers of element A.

The outer barrier layer need not necessarily be impermeable to B atoms, but in this case a metal or alloy for the outer barrier layer has to be chosen so that the thermodynamic conditions at the interface with the A metal are such that no reaction to form $A_3B$ can occur. The other conditions which the outer barrier layer should fulfil is that it should not interdiffuse too rapidly with the matrix bronze nor produce deleterious effects on $A_3B$ formed on the filaments in the bronze.

For example, we have found that there is no reaction on niobium embedded in silver alloys containing 2 atomic percent tin when this is heated at temperatures below the solidus. Layers of silver or dilute silver tin alloys should therefore prevent $Nb_3Sn$ formation on niobium barriers. However, such barriers are unlikely to provide complete protection, except possibly at low temperatures, since tin lowers the melting point of copper-silver alloys and liquation can occur at the grain boundaries of the silver and the bronze.

A further alternative is to modify a thin layer of bronze where it is in contact with the barrier of element A such that the formation of superconducting $A_3B$ compound is suppressed or reduced at the barrier.

Although this can be considered as an alteration to the bronze in contact with the barrier of A metal in practice it is more convenient to provide a special bronze 13c in FIG. 5, around the inner barrier tube 13. This special bronze 13c becomes joined to the matrix bronze containing the filaments of A metal during deformation and heat treatment.

The special bronze 13a may act in one of three ways:
(a) it can be such as to inhibit or slow the formation of $A_3B$ at the barrier;
(b) it can be simply deficient in the B atoms so that any reaction to form $A_3B$ will be dependent upon B atoms first diffusing from the matrix bronze into and through the special bronze into the vicinity of the barrier. The presence of the special bronze deficient in B atoms will thus slow the onset of reaction to form $A_3B$ at the barrier surface; or
(c) it can be such as to depress the transition temperature in any $A_3B$ which does form.

In the latter case the $A_3B$ formed at the barrier may cease to be superconducting altogether, but if it remains superconducting in zero fields it will cease to superconduct at the higher fields or in temperature excursions when the $A_3B$ filaments are still superconducting. In many circumstances these effects may be combined, e.g. the addition may slow $A_3B$ formation and also become incorporated in the $A_3B$ lowering its transition temperature while the special bronze may also be deficient in the B element.

The inner barrier 13 of element A should be impermeable to any addition in the bronze 13c which could adversely affect the stabilizing properties of the pure metal 14.

Since the special bronze 13c becomes joined to the matrix bronze during fabrication and heat treatment of the superconductor composite any component in the special bronze can diffuse into the matrix bronze and produce similar effects at the A filaments as at the A barrier. Since this could cause a reduction in the amount of $A_3B$ produced or in its superconducting transition temperature it is clearly important to limit these effects as much as possible by the choice of the most suitable concentration of the components of the special bronze, the configuration and size of the components in the superconducting composite, and the time and temperature of heat treatment.

In the particular example of producing $Nb_3Sn$ by the solid state reaction of niobium with tin from a copper-tin bronze the following methods of reducing the amount of superconducting $Nb_3Sn$ formation on the niobium barriers by the use of special bronzes are possible:

A. A Special Cooper Tin Bronze Containing Phosphorus

Phosphorus dissolved in copper-tin bronzes can completely inhibit the formation of $Nb_3Sn$ on niobium embedded in the bronze. This can be achieved in the tin rich solid solution alloys when the phosphorus content is greater than about 0.2 weight percent. A thin layer of a phase other than $Nb_3Sn$ is formed at the interface between the niobium and the bronze. Microprobe analysis of this layer suggested a composition 45 weight percent phosphorus, 39 weight percent niobium, 13 weight percent copper and 3 weight percent tin. However because of the thinness of this layer the copper and tin values could be due to sampling some bronze in the analysed area, and the niobium could be likewise overestimated. At lower phosphorus contents $Nb_3Sn$ formation occurs but at a slower rate than in purer bronzes, and the transition of the normal to superconducting state occurs at lower temperatures.

Thus bronzes containing more than about 0.2 weight percent phosphorus can be used to inhibit $Nb_3Sn$ formation on niobium barriers. The problems to overcome are balancing the outward flow of phosphorus against the thickness of the layer initially containing the phosphorus. If this is thick, reaction at the niobium barrier is inhibited, but the volume of the special phosphorus bronze may exceed that of the copper being protected and a significant proportion of the $A_3B$ filaments may be formed with degraded superconducting properties. If the layer is too thin the phosphorus may diffuse out too rapidly to prevent $Nb_3Sn$ formation on the niobium barrier. However in the latter case the $Nb_3Sn$ formed at the barrier may have a reduced superconducting transition temperature.

Several examples of multifilamentary composite were fabricated from the following constituents in accordance with the above described method:

(a) Matrix bronze - Copper containing 7.84 atomic percent of tin
(b) Filaments of niobium
(c) Barrier material - niobium
(d) Special bronze - Copper containing 4 atomic percent tin and 0.59 atomic percent (0.28 weight percent) of phosphorus In each case, after fabrication, the composite was subjected to heat treatment at 750° C. for 21 hours.

Various thicknesses of special bronze were tried in these examples and it was found that when the layer of special bronze was 0.0023 to 0.0030 cm thick, the special bronze layer gave complete protection from $Nb_3Sn$ formation (as judged by optical metallographic examination). However, when the special bronze layer was only 0.0007 to 0.0010 cm thick, $Nb_3Sn$ did form upon the niobium barrier. In the latter case, however, the $Nb_3Sn$ layer on the niobium barrier was only about a quarter as thick as the $Nb_3Sn$ layer which formed on the niobium filaments in the matrix bronze.

B. Copper Containing Phosphorus

The action of this alloy is similar to that of copper tin bronzes containing phosphorus except that no tin is initially present in the layer. Hence tin will have to diffuse through the layer before any $Nb_3Sn$ can form against the niobium barriers. For a given percentage addition of phosphorus the solidus temperature is depressed more in copper tin solid solution alloys than in copper, so these copper phosphorus alloys can probably be used at higher annealing temperatures than is possible with the bronzes containing phosphorus.

The use of copper without any phosphorus additions would also slow the initial rate of $Nb_3Sn$ formation on the niobium barriers.

C. Other Copper Alloys Containing No Tin

There are many copper alloys which could be used for this layer of special bronze to slow or prevent $Nb_3Sn$ formation on the niobium barriers. The following have been investigated and show promise for use as protective layers against the barriers in some circumstances.

(C1) Copper-Aluminium Alloys

There is no reaction on a niobium insert in a copper 6 atomic percent aluminium alloy when this is annealed in the solid state. When some of this aluminium is replaced by tin there is reaction to form superconducting $Nb_3Sn$ on heat treatment in the solid state. This reaction can occur when the tin concentration is only one third of the aluminium concentration in the bronze. The superconducting properties of $Nb_3Sn$ formed in tin aluminium bronzes are not very different from those formed in pure tin bronzes, so diffusion of aluminium from a layer adjacent to a niobium barrier into the main matrix bronze should produce very little deleterious effects on the $Nb_3Sn$ formed as filaments there. Strips of copper 6 atomic percent aluminium and copper 6 atomic percent tin alloys each containing a niobium insert have been rolled together for various reductions in thickness and annealed at temperatures up to 800° C. No reaction was found on the niobium in the aluminium bronze until the thickness of the aluminum bronze over the niobium had been reduced to less than 0.0005 cm. However in another experiment a niobium rod was placed in the centre of a copper 6 atomic percent aluminium alloy ingot which was then placed in a hole drilled in a copper 7.35 atomic percent tin alloy ignot in which was then fabricated to wire. A layer of $Nb_3Sn$ was found on the niobium after heat treatment in the solid state even when the thickness of the layer of copper aluminium alloy around the niobium was 0.0030 cm. The use of copper aluminium alloy layers around the niobium barrier may, however, be satisfactorily effective in that the $Nb_3Sn$ which forms may not be superconducting. We state this because, in the experiment above mentioned, microprobe analysis showed the $Nb_3Sn$ layer to contain about 2 weight percent of phosphorus which must have come from impurity phosphorus in the bronze (either the matrix bronze, the special bronze or both, but most likely from the special bronze alone). This concentration of impurity phosphorus into the $Nb_3Sn$ layer forming on the niobium barrier, whilst there occurs no such concentration of phosphorus into the $Nb_3Sn$ forming on niobium filaments in the matrix bronze, suggests to us that the aluminum may promote in some way the migration of phosphorus to the $Nb_3Sn$ layers.

(C2) Copper-Germanium Alloys

A compound which is not superconducting and which does not have the A15 crystal structure is formed when niobium embedded in a copper 6 atomic percent germanium alloy is annealed at temperatures below the solidus. When part of the germanium in the bronze is replaced by tin a similar compound is formed on the niobium on heat treatment. This occurs even when the tin concentration is three times as great as the germanium concentration. Hence copper germanium alloys will protect a niobium barrier from $Nb_3Sn$ formation. Their deleterious effects on $Nb_3Sn$ formation on filaments in the main matrix bronze can be limited by using very thin layers, or by reducing the concentration of the germanium in the special bronze.

(C3) Copper Silicon Alloys

The situation here is very similar to that in copper germanium alloys except that the non-superconducting compound formed on the niobium after solid state reaction in copper 6 atomic percent silicon alloys appears to contain particles of a second non-superconducting compound. Similar layers are formed in copper silicon alloys when some of the silicon is replaced by tin, and this occurs when the tin concentration is three times as large as the silicon concentration. The alloys are suitable for use as layers to protect niobium barriers from $Nb_3Sn$ formation, and deleterious effects on $Nb_3Sn$ filaments in the main bronze can be reduced by using thin layers and lower silicon concentrations.

A further alternative arrangement for inhibiting $A_3B$ compound formation on the barrier layer of A metal is by means of additions to the barrier metal A which suppress the formation of superconducting $A_3B$.

These additions need not be present uniformly throughout the barrier metal A provided a surface layer adjacent to the bronze contains sufficient of the additions to inhibit, or slow, the formation of the superconducting $A_3B$ compound. These surface additions can be introduced, for example, by ion implantation or by a coating process (e.g. mechanical, chemical, electrolytic or vapour deposition) followed, if necessary, by a diffusion heat treatment.

The effect of these additions are similar to those discussed for additions to the bronze - they may suppress or slow formation of the $A_3B$ at the barrier, or they may poison any $A_3B$ formed there so that its superconducting transition temperature is lowered. Additions to the barrier metal A must not contaminate the pure metal in contact with it and ruin its stabilizing effect, and they should not decrease the ductility of A very much otherwise the barriers may break during fabrication.

The invention is not restricted to the details of the foregoing example. Thus the barrier layers of metal A discussed in the foregoing examples are for protecting regions of the pure metal from contamination by B atoms in the case of $A_3B$ compound produced by reaction of filaments of A and B atoms from the bronze. There is another method for producing multifilamentary $A_3B$ whereby the A filaments are produced in a matrix of another metal and the B element is then diffused into the matrix and reacts with the A filaments to produce $A_3B$. Barriers of the A metal (protected by the methods described above) can also be used to isolate regions of pure metal from the matrix containing the A filaments in this technique, with the restriction that they must not impede the pick up of B atoms by the matrix during the manufacturing process.

We claim:

1. A method of manufacturing a superconducting member embodying a superconductor of A15 crystal structure having the general formula $A_3B$, where A comprises niobium or vanadium metal and B is one or more elements which when reacted with the metal A will form the said superconductor, which method comprises forming a composite material essentially consisting of a carrier material and one or more of the elements B, providing a plurality of discrete rods of a base material essentially consisting of the metal A within and in contact with the composite material, forming the composite material with the rods of base material therein and a metal, which is eventually to provide stabilisation, into a unitary structure in which a barrier layer of a metal A impermeable to the B element or elements is located as a diffusion barrier separating the stabilising metal from the composite material along the whole length of the unitary structure, and an additional barrier layer between the said barrier layer of metal A and the composite material, which additional barrier layer during subsequent heat treatment inhibits formation of superconducting $A_3B$ compound over the whole or a substantial part of the surface of the diffusion barrier layer of metal A which, but for the additional barrier layer could be in contact with the composite material, reducing the unitary structure to wire form by a mechanical reduction process whereby the rods of base material become filaments in a matrix of composite material and the stabilising metal together with the barrier layer extend along the length of the wire, and heat treating the wire to cause reaction between the said filaments of base material and the B element or elements to form filaments of superconducting $A_3B$ compound, whilst said additional barrier layer inhibits formation of superconducting $A_3B$ compound over the whole or a substantial part of the said surface of the diffusion barrier layer, said carrier material comprising an element selected from the group consisting of copper, silver and gold, which element under said heat treatment neither reacts substantially with the base material nor undesirably influences reaction between the chosen B element or elements and the base material.

2. A method as claimed in claim 1, wherein the said additional barrier layer is impermeable to the B element or elements.

3. A method as claimed in claim 1, wherein the said additional barrier layer is permeable to the B element or elements but inhibits reaction between permeating B atoms and the metal A, the heat treatment being controlled for avoiding melting of the composite material in contact with the base material at any stage during the heat treatment.

4. A method as claimed in claim 1 wherein the B element or elements comprises one or more of the elements of the group consisting of aluminum, gallium, indium, silicon, germanium, gold, platinum, antimony, rhodium, palladium, osmium, ruthenium, cobalt, thallium, lead, arsenic, bismuth, iridium, and tin.

5. A method as claimed in claim 4, wherein the B element comprises one or more of the elements of the group consisting of aluminium, gallium, indium, silicon, germanium and tin.

6. A method as claimed in claim 1, wherein the heat treatment is controlled for avoiding melting of the composite material in contact with the base material at any stage during the heat treatment.

7. A method as claimed in claim 3, wherein the composite material comprises a solid solution of the element or elements of the said group in the carrier material.

8. A method as claimed in claim 7, wherein two or more of the elements of the said group exist together in solid solution in the carrier material and react together with the base material to form a ternary or higher order superconductive compound.

9. The method of claim 1, wherein said additional barrier layer inhibits formation of $A_3B$ compound over the whole of the surface of the diffusion barrier layer of metal A.

* * * * *